United States Patent
Ueta

(10) Patent No.: US 12,040,429 B2
(45) Date of Patent: Jul. 16, 2024

(54) LIGHT-EMITTING ELEMENT AND LIGHT-EMITTING DEVICE

(71) Applicant: SHARP KABUSHIKI KAISHA, Sakai (JP)

(72) Inventor: Yoshihiro Ueta, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 516 days.

(21) Appl. No.: 17/311,861

(22) PCT Filed: Dec. 10, 2018

(86) PCT No.: PCT/JP2018/045361
§ 371 (c)(1),
(2) Date: Jun. 8, 2021

(87) PCT Pub. No.: WO2020/121381
PCT Pub. Date: Jun. 18, 2020

(65) Prior Publication Data
US 2022/0020898 A1 Jan. 20, 2022

(51) Int. Cl.
H01L 33/14 (2010.01)
H01L 33/00 (2010.01)
H01L 33/06 (2010.01)
H01L 33/36 (2010.01)

(52) U.S. Cl.
CPC .......... *H01L 33/14* (2013.01); *H01L 33/0008* (2013.01); *H01L 33/06* (2013.01); *H01L 33/36* (2013.01)

(58) Field of Classification Search
None
See application file for complete search history.

(56) References Cited

U.S. PATENT DOCUMENTS

| | | | |
|---|---|---|---|
| 9,768,404 B1 * | 9/2017 | Steckel | H10K 50/165 |
| 2007/0001581 A1 * | 1/2007 | Stasiak | H01L 33/08 |
| | | | 313/498 |
| 2007/0103068 A1 * | 5/2007 | Bawendi | B65D 81/261 |
| | | | 313/506 |
| 2012/0238047 A1 | 9/2012 | Bawendi et al. | |
| 2012/0292595 A1 | 11/2012 | Bawendi et al. | |
| 2013/0037778 A1 * | 2/2013 | Kazlas | C09K 11/883 |
| | | | 257/E29.024 |
| 2013/0146838 A1 * | 6/2013 | Ku | H01L 31/06 |
| | | | 257/13 |

(Continued)

FOREIGN PATENT DOCUMENTS

| | | |
|---|---|---|
| CN | 105470387 A | 4/2016 |
| JP | 2012-023388 A | 2/2012 |

OTHER PUBLICATIONS

Hyo-Min Kim et al., "Solution-Processed Metal-Oxide p-n Charge Generation Junction for High-Performance Inverted Quantum-Dot Light-Emitting Diodes", Applied materials & interfaces, 2017, 9, 38678-38686, https://doi.org/10.1021/acsami.7b14584, Oct. 18, 2017.

*Primary Examiner* — Evren Seven
(74) *Attorney, Agent, or Firm* — ScienBiziP, P.C.

(57) ABSTRACT

A light-emitting element includes: an anode; a hole transport layer of a p-type semiconductor; a n-type semiconductor layer containing a Group 13 element; a light-emitting layer containing quantum dots; an electron transport layer; and a cathode, arranged in this order.

20 Claims, 7 Drawing Sheets

(56) References Cited

U.S. PATENT DOCUMENTS

| | | | |
|---|---|---|---|
| 2016/0079316 A1* | 3/2016 | Zhou | H10K 59/00 |
| | | | 257/13 |
| 2017/0125635 A1 | 5/2017 | Bawendi et al. | |
| 2017/0186909 A1* | 6/2017 | Kim | H01L 33/06 |
| 2018/0019371 A1* | 1/2018 | Steckel | H01L 27/1225 |
| 2018/0047923 A1 | 2/2018 | Xu | |
| 2018/0261796 A1 | 9/2018 | Jang et al. | |
| 2019/0103524 A1* | 4/2019 | Jang | G02F 1/133603 |
| 2019/0131492 A1* | 5/2019 | Kang | H01L 33/26 |
| 2020/0058829 A1* | 2/2020 | Kim | H01L 33/504 |
| 2020/0135984 A1* | 4/2020 | Jang | C09K 11/565 |

\* cited by examiner (a)

(b)

(a)

(b)

LIGHT-EMITTING ELEMENT AND LIGHT-EMITTING DEVICE

TECHNICAL FIELD

The present disclosure relates to light-emitting elements containing quantum dots in a light-emitting layer thereof and also to light-emitting devices including such a light-emitting element.

BACKGROUND ART

Patent Literature 1 discloses a light-emitting device including light-emitting elements containing semiconductor nanocrystals.

CITATION LIST

Patent Literature

Patent Literature 1: Japanese Unexamined Patent Application Publication, Tokukai, No. 2012-23388

SUMMARY

Technical Problem

Patent Literature 1 describes a hole transport layer made of NiO. The light-emitting element that includes a hole transport layer made of NiO or a like conventional material and that contains quantum dots in a light-emitting layer thereof can hardly achieve both sufficient electron-blocking properties and a good efficiency of hole injection to the light-emitting layer.

Solution to Problem

To address these problems, the present disclosure is directed to a light-emitting element including: an anode; a hole transport layer of a p-type semiconductor; a n-type semiconductor layer containing a Group 13 element; a light-emitting layer containing quantum dots; an electron transport layer; and a cathode, arranged in this order.

Advantageous Effects of Disclosure

This structure enables the provision of a light-emitting element that exhibits an improved efficiency of hole injection to the light-emitting layer without compromising on electron-blocking properties.

DESCRIPTION OF EMBODIMENTS

Embodiment 1

Throughout the present specification, the Roman numerals denoting groups of elements follow the defunct CAS group-numbering system, and the Arabic numerals denoting groups of elements follow the current IUPAC group-numbering system.

Figure 1:
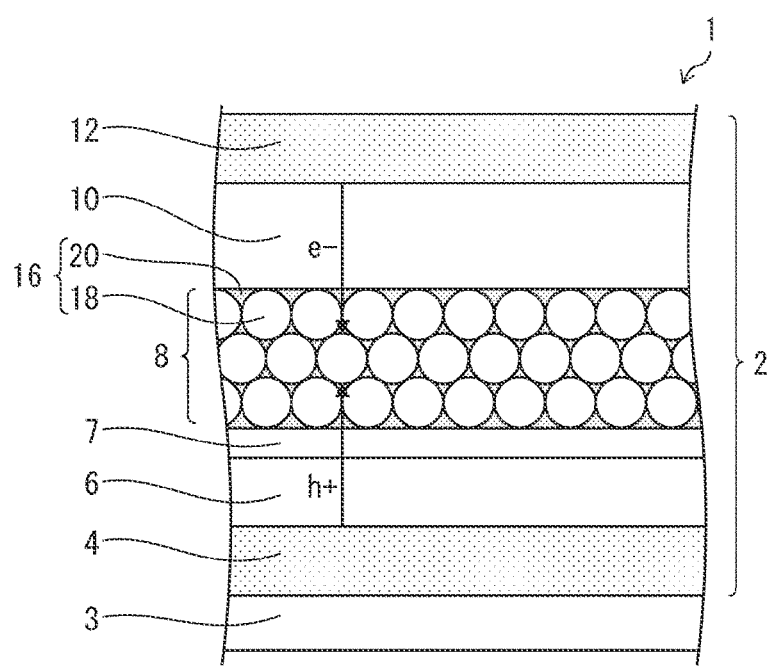
FIG. 1 is a schematic cross-sectional view of a light-emitting device in accordance with Embodiment 1 of the present disclosure.

FIG. 1 is a schematic cross-sectional view of a light-emitting device 1 in accordance with the present embodiment.

Referring to FIG. 1, the light-emitting device 1 in accordance with the present embodiment includes a light-emitting element 2 and an array substrate 3. The light-emitting device 1 has a structure in which the layers that form the light-emitting element 2 are stacked on the array substrate 3 that carries TFTs (thin film transistors, not shown) thereon. The direction from the light-emitting element 2 to the array substrate 3 in the light-emitting device 1 will be referred to as the "downward direction" throughout the present specification. Meanwhile, the direction from the array substrate 3 for the light-emitting element 2 to the light-emitting element 2 will be referred to as the "upward direction" throughout the present specification.

The light-emitting element 2 includes a hole transport layer 6, a n-type semiconductor layer 7, a light-emitting layer 8, an electron transport layer 10, and a cathode 12 arranged in this order on an anode 4 when viewed from the underlying anode 4. The anode 4 of the light-emitting element 2, provided on the array substrate 3, is electrically connected to one of the TFTs on the array substrate 3. In an alternative embodiment, the light-emitting element may include a cathode on the array substrate and further include an electron transport layer, a light-emitting layer, a n-type semiconductor layer, a hole transport layer, and an anode arranged in this order on the cathode.

The anode 4 and the cathode 12 contain a conductive material and are electrically connected to the hole transport layer 6 and the electron transport layer 10 respectively.

Either the anode 4 or the cathode 12 is a transparent electrode. The transparent electrode may be formed of, for example, ITO, IZO, ZnO, AZO, or BZO by, for example, sputtering. Either the anode 4 or the cathode 12 may contain a metal material. The metal material is preferably Al, Cu, Au, Ag, or a like material that exhibits a high reflectance in the visible range.

The light-emitting layer 8 contains quantum dots (semiconductor nanoparticles) 16. The light-emitting layer 8 may include a stack of light-emitting layers. The quantum dots 16 are not necessarily arranged regularly in the light-emitting layer 8 as shown in FIG. 1 and may be disordered in the light-emitting layer 8. The light-emitting layer 8 can be formed of a dispersion solution containing the quantum dots 16 dispersed in a medium such as hexane or toluene, by spin-coating or inkjet printing. The dispersion solution may additionally contain a dispersant such as thiol or amine. The light-emitting layer 8 preferably has a thickness of 5 to 50 nm.

The quantum dots 16 have a valence band and a conduction band and emit light when the holes in the valence band and the electrons in the conduction band recombine. The emission from the quantum dots 16 has a narrow spectrum due to the quantum confinement effect and hence exhibits a relatively deep chromaticity.

The quantum dots 16 have a core/shell structure including a core 18 and a shell 20 surrounding the core 18 in the present embodiment. The core 18 is a semiconductor material particle that has a band gap within the band gap of the shell 20. The core 18 may contain a Group II-VI semiconductor material or a Group III-V semiconductor material. The shell 20 contains a Group II-VI semiconductor material.

The quantum dots 16 may contain, for example, CdSe in the core and ZnS in the shell. The quantum dots 16 may contain any other suitable material used in the field of technology. For example, the quantum dots 16 may have a core/shell structure such as a CdSe/CdS, InP/ZnS, ZnSe/ZnS, or CIGS/ZnS structure.

The quantum dots 16 have a particle diameter of approximately 3 to 15 nm. The wavelength of the emission from the quantum dots 16 is controllable through the particle diameter of the core 18. Therefore, the wavelength of the light emitted by the light-emitting device 1 can be controlled by controlling the particle diameter of the core 18. The light-emitting layer 8 may further contain ligands coordinately bonded to the shells 20 of the quantum dots 16.

The hole transport layer 6 transports holes from the anode 4 to the light-emitting layer 8. In the present embodiment, the hole transport layer 6 is a p-type semiconductor layer. The hole transport layer 6 contains an oxide of any of Group IIA elements, Group VIB elements, and Group VIIIB elements. In other words, the hole transport layer 6 contains an oxide of any of Group 6 elements, Group 8 to 10 elements, and Group 12 elements. For example, the hole transport layer 6 is a p-type semiconductor layer containing at least any of MgO, $Cr_2O_3$, and NiO. The layers in the hole transport layer 6 may be formed by sputtering. The hole transport layer 6 preferably has a thickness of 5 to 40 nm.

The hole transport layer 6 has a function of blocking electrons moving from the light-emitting layer 8 to the anode 4 in the present embodiment. For this reason, the hole transport layer 6 preferably has a lower electron affinity than do the shells 20 in the light-emitting layer 8.

The electron transport layer 10 transports electrons from the cathode 12 to the light-emitting layer 8. The electron transport layer 10 may have a function of disrupting hole transport. The electron transport layer 10 may contain, for example, ZnO, $TiO_2$, $Ta_2O_3$, or $SrTiO_3$ and formed by sputtering. The electron transport layer 10 may have a conventional, publicly known thickness, preferably from 10 to 100 nm.

In the present embodiment, the light-emitting element 2 includes the n-type semiconductor layer 7 between the hole transport layer 6 and the light-emitting layer 8. The n-type semiconductor layer 7 contains a first semiconductor material that is a Group II-VI semiconductor material. The first semiconductor material may include ZnS, ZnSe, and CdS.

The shell 20 contains a Group II-VI semiconductor material that will be hereafter referred to as a second semiconductor material. In this example, the first semiconductor material is the same as the second semiconductor material. Alternatively, the first semiconductor material contains a Group II element that, in the periodic table, is placed in a period below the Group II element contained in the second semiconductor material. For instance, when the shell 20 contains Zn, the n-type semiconductor layer 7 may contain Zn or Cd.

The n-type semiconductor layer 7 contains a Group 13 element as a dopant. The Group 13 element contained in the n-type semiconductor layer 7 may include, for example, at least one of elements B, Al, Ga, and In. The n-type semiconductor layer 7 contains the Group 13 element in a concentration of from $10^{16}$ $cm^{-3}$ to $10^{22}$ $cm^{-3}$. In other words, in the present embodiment, the n-type semiconductor layer 7 is a $n^+$-type semiconductor layer. The n-type semiconductor layer 7 may have a Group 13 element concentration that increases from the light-emitting layer 8 toward the hole transport layer 6.

The n-type semiconductor layer 7 is formed on the light-emitting layer 8 or the hole transport layer 6 by sputtering using, for example, a material doped in advance with a n-type impurity as a target. The n-type semiconductor layer 7 may alternatively formed by, for example, applying nanoparticles of a n-type semiconductor material. As another alternative, the n-type semiconductor layer 7 may be formed by sputtering while simultaneously doping a target material with a n-type impurity.

Next will be described the energy bands of the layers in the light-emitting element 2 in accordance with the present embodiment with reference to FIG. 2.

Figure 2:
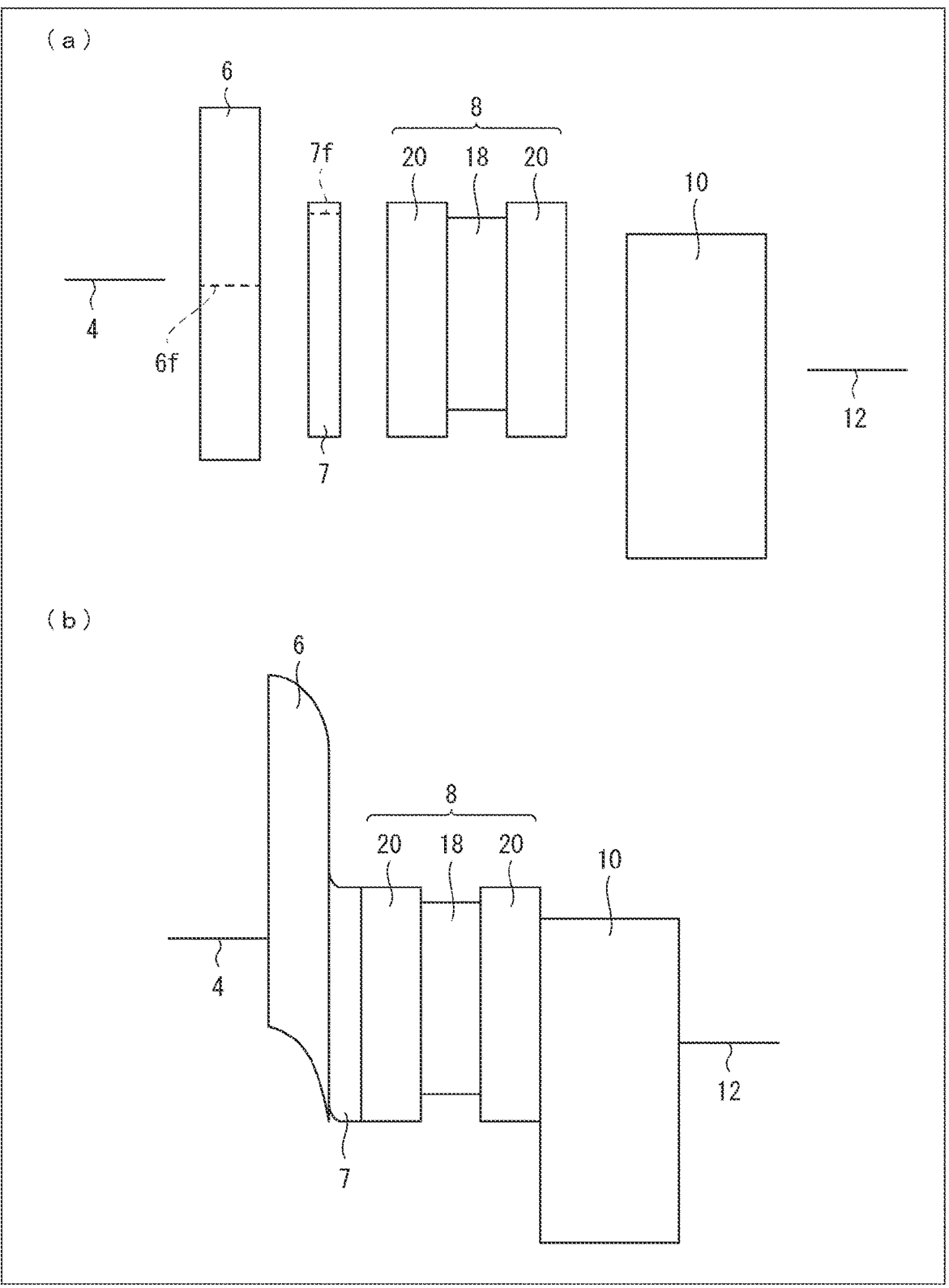
FIG. 2 is a set of energy band diagrams illustrating examples of the Fermi levels/band gaps of layers in a light-emitting element in accordance with Embodiment 1 of the present disclosure.

Portion (a) of FIG. 2 is an energy band diagram illustrating examples of Fermi levels/band gaps when the layers in the light-emitting element 2 in accordance with the present embodiment are not stacked.

The energy band diagrams in the present specification show the energy level of each layer relative to the vacuum energy level thereof. The energy band diagrams in the present specification also show numerals indicating the specific members in which the Fermi level or energy level occurs. The Fermi level is shown for the anode 4 and the cathode 12. The band gap from the electron affinity to the ionization potential is shown for the hole transport layer 6, the n-type semiconductor layer 7, the light-emitting layer 8, and the electron transport layer 10. Individual band gaps are shown for the core 18 and the shell 20 of the light-emitting layer 8.

In the present embodiment, as an example, when the hole transport layer 6 contains NiO, the hole transport layer 6 exhibits an ionization potential of 5.6 eV and an electron affinity of 2.1 eV. In the present embodiment, as another example, when the electron transport layer 10 contains ZnO, the electron transport layer 10 exhibits an ionization potential of 7.0 eV and an electron affinity of 3.8 eV. In the present embodiment, as a further example, when the shell 20 contains ZnS, the shell 20 exhibits an ionization potential of 5.2 eV and an electron affinity of 3.2 eV.

Table 1 shows Examples 1 to 10 of combinations of materials for the layers (not stacked) in the present embodiment. In the columns under "Ionization Potential" and "Electron Affinity," Table 1 shows energy levels in units of eV relative to a vacuum energy level.

TABLE 1

| | Hole Transport Layer | | | N-type Semiconductor Layer | | | | | Shell | | |
|---|---|---|---|---|---|---|---|---|---|---|---|
| | | | | Base Material | | | Dopant | | | | |
| | Comp. | IP (eV) | EA (eV) | Comp. | IP (eV) | EA (eV) | Comp. | Temp. | Comp. | IP (eV) | EA (eV) |
| Ex. 1 | NiO | 5.6 | 2.1 | ZnS | 5.2 | 3.2 | Al | 1.00E+18 | ZnS | 5.2 | 3.2 |
| Ex. 2 | Cr$_2$O$_3$ | 6.3 | 3.2 | ZnSe | 5.5 | 2.7 | Al | 1.00E+20 | ZnSe | 5.5 | 2.7 |
| Ex. 3 | MgO | 8.9 | 1 | CdS | 6.2 | 3.7 | Al | 1.00E+22 | CdS | 6.2 | 3.7 |
| Ex. 4 | NiO | 5.6 | 2.1 | ZnS | 5.2 | 3.2 | In | 1.00E+18 | ZnS | 5.2 | 3.2 |
| Ex. 5 | Cr$_2$O$_3$ | 6.3 | 3.2 | ZnSe | 5.5 | 2.7 | In | 1.00E+20 | ZnSe | 5.5 | 2.7 |
| Ex. 6 | MgO | 8.9 | 1 | CdS | 6.2 | 3.7 | In | 1.00E+22 | CdS | 6.2 | 3.7 |
| Ex. 7 | NiO | 5.6 | 2.1 | ZnS | 5.2 | 3.2 | Ga | 1.00E+18 | ZnS | 5.2 | 3.2 |
| Ex. 8 | Cr$_2$O$_3$ | 6.3 | 3.2 | ZnSe | 5.5 | 2.7 | Ga | 1.00E+20 | ZnSe | 5.5 | 2.7 |
| Ex. 9 | MgO | 8.9 | 1 | CdS | 6.2 | 3.7 | Ca | 1.00E+22 | CdS | 6.2 | 3.7 |
| Ex. 10 | CuAlO$_2$ | 5.4 | 2.5 | ZnS | 5.2 | 3.2 | B | 1.00E+18 | ZnS | 5.2 | 3.2 |

Ex.: Example
Comp.: Composition
IP: Ionization Potential
EA: Electron Affinity

Table 1 shows the composition, ionization potential, and electron affinity of the hole transport layer 6 for Examples 1 to 10 in the columns under "Composition," "Ionization Potential," and "Electron Affinity" respectively under "Hole Transport Layer." Table 1 also shows the composition, ionization potential, and electron affinity of the base material for the n-type semiconductor layer 7 for Examples 1 to 10 in the columns under "Composition," "Ionization Potential," and "Electron Affinity" respectively under "Base Material" under "N-type Semiconductor Layer." Table 1 further shows the dopant composition for the n-type semiconductor layer 7 and the dopant concentration in the base material of the n-type semiconductor layer 7 for Examples 1 to 10 in the columns under "Composition" and "Concentration" respectively under "Dopant" under "N-type Semiconductor Layer." Table 1 additionally shows the composition, ionization potential, and electron affinity of the shell 20 for Examples 1 to 10 in the columns under "Composition," "Ionization Potential," and "Electron Affinity" respectively under "Shell."

Portion (b) of FIG. 2 is an energy band diagram illustrating examples of Fermi levels/band gaps when the layers in the light-emitting element 2 in accordance with the present embodiment are stacked.

The Fermi levels/band gaps of the anode 4, the light-emitting layer 8, the electron transport layer 10, and the cathode 12 in isolation do not change much when stacked in the light-emitting element 2 in the present embodiment. In contrast, the electron affinity and ionization potential of the hole transport layer 6 and the n-type semiconductor layer 7 change in the light-emitting element 2 where the layers are stacked, as shown in (b) of FIG. 2, because the hole transport layer 6 and the n-type semiconductor layer 7 form a p-n junction.

Specifically, the band structure of the hole transport layer 6 shifts towards the n-type semiconductor layer 7 due to this p-n junction. In other words, the electron affinity and ionization potential of the hole transport layer 6 decrease as moving from the n-type semiconductor layer 7 toward the anode 4. The electron affinity and ionization potential of the n-type semiconductor layer 7 similarly decrease as moving from the hole transport layer 6 toward the light-emitting layer 8.

When the hole transport layer 6 and the n-type semiconductor layer 7 form a p-n junction, the carriers in the n-type semiconductor layer 7 flow into the hole transport layer 6 in large amounts to satisfy the charge neutral condition. The carrier concentration in the hole transport layer 6 is therefore $10^{16}$ cm$^{-3}$ to $10^{22}$ cm$^{-3}$ relative to the total volume of the hole transport layer 6. In other words, in the present embodiment, when the hole transport layer 6 and the n-type semiconductor layer 7 are stacked, a broad depletion layer forms in the hole transport layer 6 which is a p-type semiconductor layer.

The carrier density is much higher in the n-type semiconductor layer 7 in isolation than in the hole transport layer 6 in isolation. The electron affinity and ionization potential therefore change more in the hole transport layer 6 than in the n-type semiconductor layer 7 due to the p-n junction formed by the hole transport layer 6 and the n-type semiconductor layer 7.

Specifically, the electron affinity and ionization potential change much in the hole transport layer 6 all the way from the interface between the hole transport layer 6 and the n-type semiconductor layer 7 to the interface between the hole transport layer 6 and the anode 4. In contrast, the electron affinity and ionization potential change slightly in the n-type semiconductor layer 7 only near the interface between the hole transport layer 6 and the n-type semiconductor layer 7.

The amounts of change in the electron affinity and ionization potential of the hole transport layer 6 and the n-type semiconductor layer 7 due to the p-n junction formed by the hole transport layer 6 and the n-type semiconductor layer 7 are equivalent to the difference between the Fermi level of the hole transport layer 6 and the Fermi level of the n-type semiconductor layer 7 before the hole transport layer 6 and the Fermi level of the n-type semiconductor layer 7 form a p-n junction.

The hole transport layer 6 in isolation has a Fermi level 6f denoted by a dotted line in (a) of FIG. 2. The carrier density is so low in the hole transport layer 6 in isolation that the Fermi level 6f can be safely assumed to be the approximate center of the band gap. The n-type semiconductor layer 7 in isolation has a Fermi level 7f denoted by dotted line in (a) of FIG. 2. The carrier density is so high in the n-type semiconductor layer 7 in isolation that the Fermi level 7f is sufficiently close to the electron affinity to be safely assumed to be approximately equal to the electron affinity. When the hole transport layer 6 and the n-type semiconductor layer 7 form a p-n junction, the carriers in the n-type semiconductor layer 7 flow into the hole transport layer 6, which in turn averages the Fermi levels of the hole transport layer 6 and the n-type semiconductor layer 7.

It is hence inferred that the amounts of change in the electron affinity and ionization potential of the hole transport layer 6 and the n-type semiconductor layer 7 are equal to the difference between the energy level at the center of the band gap of the hole transport layer 6 and the electron affinity of the n-type semiconductor layer 7.

The effects of the light-emitting element 2 in accordance with the present embodiment will be described next by comparing an energy band diagram for the light-emitting element 2 in accordance with the present embodiment with an energy band diagram for a light-emitting element in accordance with a comparative example, both diagrams being shown in FIG. 3.

Figure 3:
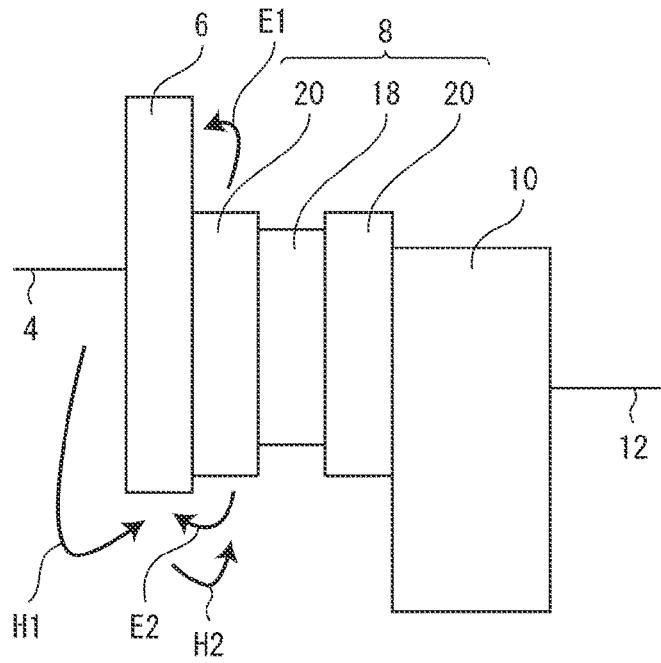
FIG. 3 is a set of energy band diagrams for layers in the light-emitting element in accordance with Embodiment 1 of the present disclosure and layers in a light-emitting element in accordance with a comparative example, depicting the effects of the light-emitting element in accordance with Embodiment 1 of the present disclosure.
Figure 3:
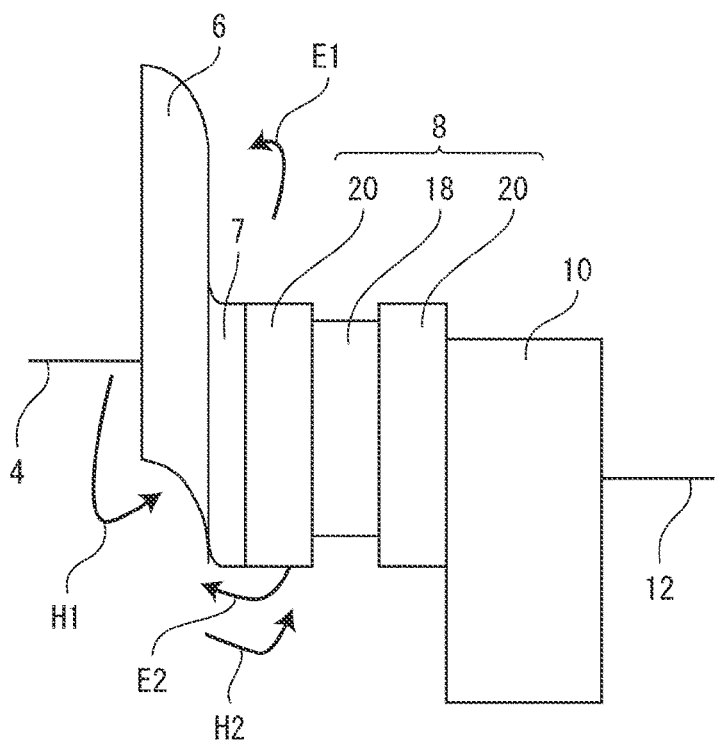

Portion (a) of FIG. 3 is an energy band diagram for the layers in a light-emitting element in accordance with a comparative example. The light-emitting element in accordance with the comparative example structurally differs from the light-emitting element 2 in accordance with the present embodiment only in that the former includes on n-type semiconductor layer 7. Accordingly, the energy levels of the layers in the light-emitting element in accordance with the comparative example can be safely assumed to be respectively equal to the energy levels of the layers in isolation for the light-emitting element 2 in accordance with the present embodiment before the layers are stacked.

As a potential difference develops between the anode 4 and the cathode 12 in the light-emitting element in accordance with the comparative example, holes are injected from the anode 4 to the hole transport layer 6, and electrons are injected from the cathode 12 to the electron transport layer 10. The holes injected the hole transport layer 6 and the electrons injected the electron transport layer 10 reach the cores 18 of the quantum dots 16 in the light-emitting layer 8 via the shells 20 thereof. The holes and the electrons recombine in the cores 18, generating excitons.

If the electron affinity of the hole transport layer 6 is higher than the electron affinity of the shell 20, the electron affinity of the hole transport layer 6 blocks additional electrons from being transported to the hole transport layer 6 via the shells 20 as indicated by arrow E1 in (a) of FIG. 3. This particular mechanism increases the concentration of electrons remaining in the light-emitting layer 8, thereby improving light-emitting efficiency.

In contrast, in the comparative example, there is a relatively large difference between the Fermi level of the anode 4 and the ionization potential of the hole transport layer 6. The barrier to hole injection from the anode 4 to the hole transport layer 6 is therefore relatively high as indicated by arrow H1 in (a) of FIG. 3.

Further in the comparative example, the ionization potential of the hole transport layer 6 is higher than the ionization potential of the shell 20. The concentration of holes in the hole transport layer 6 is therefore relatively low. The hole injection from the hole transport layer 6 to the shell 20 indicated by arrow H2 in (a) of FIG. 3, that is, the electron attraction from the shell 20 to the hole transport layer 6 indicated by arrow E2 in (a) of FIG. 3, is therefore unlikely to occur in the light-emitting element in accordance with the comparative example.

This barrier to hole injection hence reduces the efficiency of hole injection to the light-emitting layer 8 in the light-emitting element in accordance with the comparative example. That in turn lowers charge carrier balance in the light-emitting layer 8, thereby increasing the non-light-emission process in the light-emitting layer 8 and reducing the overall external quantum efficiency of the light-emitting element.

The hole transport layer 6 can be made of a material with a smaller band gap if it is only the efficiency of hole injection that needs to be improved. Simply reducing the band gap of the hole transport layer 6 alone however may not improve the external quantum efficiency of the light-emitting element because the reduced band gap of the hole transport layer 6 renders the hole transport layer 6 less capable of blocking the transport of electrons from the light-emitting layer 8 to the anode 4.

Portion (b) of FIG. 3 is an energy band diagram for the layers in the light-emitting element 2 in accordance with the present embodiment. The light-emitting element 2 in accordance with the present embodiment operates by the same mechanism as the light-emitting element in accordance with the comparative example, transporting holes and electrons so as to generate excitons in the light-emitting layer 8. A notable difference lies in that in the former, holes are injected from the hole transport layer 6 to the shell 20 by tunneling through the n-type semiconductor layer 7 by virtue of the tunneling effect of the n-type semiconductor layer 7.

The p-n junction formed by the hole transport layer 6 and the n-type semiconductor layer 7 increases the electron affinity of the hole transport layer 6 in the present embodiment. The hole transport layer 6 therefore continues to have the function of blocking the transport of electrons from the light-emitting layer 8 to the anode 4 indicated by arrow E1 in (a) of FIG. 3.

In the present embodiment, the p-n junction formed by the hole transport layer 6 and the n-type semiconductor layer 7 significantly lowers the ionization potential of the hole transport layer 6 near the anode 4. The barrier to hole injection from the anode 4 to the hole transport layer 6 is therefore lowered as indicated by arrow H1 in (b) of FIG. 3.

The p-n junction formed by the hole transport layer 6 and the n-type semiconductor layer 7 also lowers the ionization potential of the hole transport layer 6 near the n-type semiconductor layer 7. The concentration of holes in the hole transport layer 6 therefore increases. The hole injection from the hole transport layer 6 to the shell 20 indicated by arrow H2 in (b) of FIG. 3, that is, the electron attraction from the shell 20 to the hole transport layer 6 indicated by arrow E2 in (b) of FIG. 3, is therefore likely to occur.

This mechanism improves the efficiency of hole transport from the anode 4 to the light-emitting layer 8 in the light-emitting element 2 in accordance with the present embodiment as described earlier. That in turn improves charge carrier balance in the light-emitting layer 8, thereby increasing the light-emission process in the light-emitting layer 8 and improving the overall external quantum efficiency of the light-emitting element 2.

Table 2 is a table of comparison of the difference in ionization potential between the hole transport layer 6 and the shell 20 and the difference in electron affinity between the hole transport layer 6 and the shell 20 in the light-emitting element 2 in accordance with the present embodiment before and after the layers are stacked to form the light-emitting element 2. Table 2 shows all values in units of eV. The examples in Table 2 correspond to the respective examples in Table 1.

TABLE 2

| | Before Stacking | | After Stacking | | |
|---|---|---|---|---|---|
| | Difference in IP (eV) | Difference in EA (eV) | Change in EL (eV) | Difference in IP (eV) | Difference in EA (eV) |
| Example 1 | 0.4 | 1.1 | 0.65 | −0.25 | 1.75 |
| Example 2 | 0.8 | −0.5 | 2.05 | −1.25 | 1.55 |
| Example 3 | 2.7 | 2.7 | 1.25 | 1.45 | 3.95 |
| Example 4 | 0.4 | 1.1 | 0 65 | −0.25 | 1.75 |
| Example 5 | 0.8 | −0.5 | 2.05 | −1.25 | 1.55 |
| Example 6 | 2.7 | 2.7 | 1.25 | 1.45 | 3.95 |
| Example 7 | 0.4 | 1.1 | 0.65 | −0.25 | 1.75 |
| Example 8 | 0.8 | −0.5 | 2.05 | −1.25 | 1.55 |
| Example 9 | 2.7 | 2.7 | 1.25 | 1.45 | 3.95 |
| Example 10 | 0.2 | 0.7 | 0.75 | −0.55 | 1.45 |

IP: Ionization Potential
EA: Electron Affinity
EL: Energy Level

Table 2, in the columns under "Difference in Ionization Potential," shows values that remain when the ionization potential of the shell 20 is subtracted from the ionization potential of the hole transport layer 6 before and after the stacking. Negative values in the columns under "Difference in Ionization Potential" indicate that the ionization potential of the hole transport layer 6 is lower than the ionization potential of the shell 20.

Table 2, in the columns under "Difference in Electron Affinity," shows values that remain when the electron affinity of the hole transport layer 6 is subtracted from the electron affinity of the shell 20 before and after the stacking. In other words, the values in the columns under "Difference in Electron Affinity" are equivalent to the barrier to electron transport from the light-emitting layer 8 to the anode 4. Negative values in the columns under "Difference in Electron Affinity" indicate that the electron affinity of the hole transport layer 6 is higher than the electron affinity of the shell 20.

Table 2 shows an amount of change in the electron affinity and ionization potential of both the hole transport layer 6 and the n-type semiconductor layer 7 after the stacking in the column under "Change in Energy Level." The values in the "Change in Energy Level" column are calculated assuming, as described earlier, that the amount of change in the electron affinity and ionization potential is equal to the difference between the energy level at the center of the band gap of the hole transport layer 6 and the electron affinity of the n-type semiconductor layer 7.

Table 2 demonstrates that when the layers are stacked, the values in the "Ionization Potential" columns decrease, and the values in the "Electron Affinity" columns increase, across all the examples. These results show that when the layers are stacked, the concentration of holes in the hole transport layer 6 increases, and the barrier to electron transport from the light-emitting layer 8 to the anode 4 increases.

The n-type semiconductor layer 7 and the shell 20 are made of the same material in all the examples of the present embodiment. The material for the n-type semiconductor layer 7 is however preferably a Group II-VI semiconductor material containing a Group II element that, in the periodic table, is placed in a period below the Group II element contained in the material for the shell 20. In this preferred composition, the Group II-VI type semiconductor that forms the n-type semiconductor layer 7 contains an element having a greater ionic radius then does the material for the shell 20. Therefore, the n-type semiconductor layer 7 exhibits relatively weak valence orbit bonding and a low energy level at the top of the valence band (i.e., a low ionization potential), which further lowers the barrier to hole injection from the hole transport layer 6 to the shell 20.

The n-type semiconductor layer 7 is a $n^+$-type semiconductor layer in the present embodiment. Particularly, the concentration of the Group 13 element that is a dopant for the n-type semiconductor layer 7 is greater than or equal to $10^{16}$ cm$^{-3}$. The dopant concentration in the n-type semiconductor layer 7 is therefore sufficiently high that there occur thorough changes in the ionization potential and electron affinity of the hole transport layer 6 as described earlier. The concentration of the Group 13 element that is a dopant for the n-type semiconductor layer 7 is preferably less than or equal to $10^{22}$ cm$^{-3}$ from the point of view of preventing changes in the composition of the crystals of the II-VI type semiconductor contained in the n-type semiconductor layer 7.

The n-type semiconductor layer 7 preferably has a thickness of greater than or equal to 1 nm in the present embodiment from the point of view of more reliably forming the n-type semiconductor layer 7 and reducing carrier traps in the n-type semiconductor layer 7. The n-type semiconductor layer 7 preferably has a thickness of less than or equal to 5 nm in the present embodiment so that the n-type semiconductor layer 7 can exhibit a sufficient hole tunneling effect.

Embodiment 2

Figure 4:
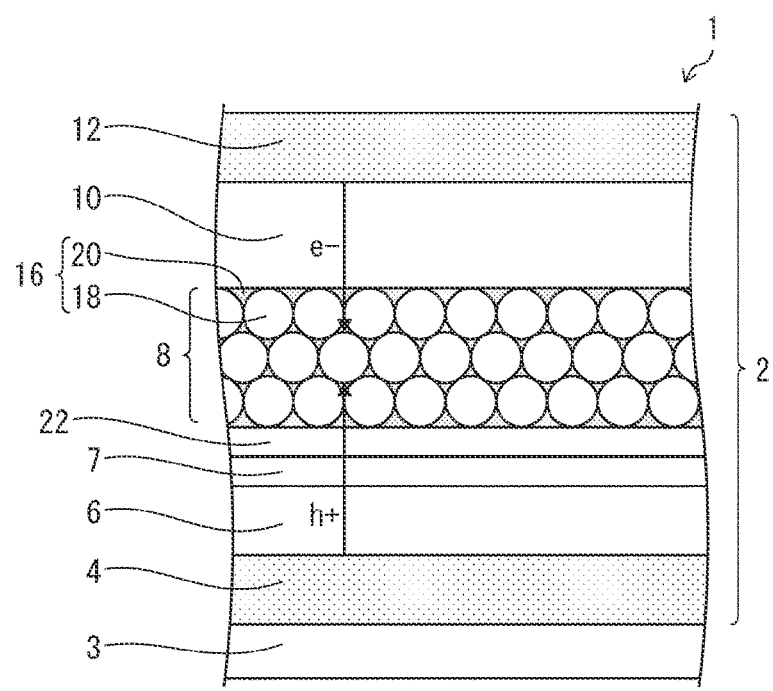
FIG. 4 is a schematic cross-sectional view of a light-emitting device in accordance with Embodiment 2 of the present disclosure.

FIG. 4 is a schematic cross-sectional view of a light-emitting device 1 in accordance with the present embodiment. The light-emitting device 1 in accordance with the present embodiment has the same structure as the light-emitting device 1 in accordance with the preceding embodiment, except that the former includes a non-conducting layer 22 between the n-type semiconductor layer 7 and the light-emitting layer 8.

The non-conducting layer 22 contains a non-conductor that refers to a substance containing almost no carriers and exhibiting extremely poor electric conductivity. Generally, the non-conductor is referred to as the insulator or the dielectric. Specifically, the non-conducting layer 22 contains at least one species selected from the group consisting of, for example, $Al_2O_3$, SiN, $SiO_2$, SiON, and $Cr_2O_3$. The non-conducting layer 22 is in contact with both the n-type semiconductor layer 7 and the light-emitting layer 8.

The light-emitting element 2 in accordance with the present embodiment operates by the same mechanism as the light-emitting element 2 in accordance with the preceding embodiment, transporting holes and electrons so as to generate excitons in the light-emitting layer 8. A notable difference lies in that in the former, holes are injected from the n-type semiconductor layer 7 to the shell 20 by tunneling through the non-conducting layer 22 by virtue of the tunneling effect of the non-conducting layer 22.

The effects of the light-emitting element 2 in accordance with the present embodiment will be described next by comparing an energy band diagram for the light-emitting element 2 in accordance with the present embodiment with an energy band diagram for the light-emitting element 2 in accordance with the preceding embodiment, both diagrams being shown in FIG. 5. Portions (a) and (b) of FIG. 5 are enlarged energy band diagrams for the light-emitting element 2 in accordance with the preceding embodiment and the light-emitting element 2 in accordance with the present embodiment respectively, selectively showing only the vicinity of the ionization potential from the hole transport layer 6 to the shell 20.

The n-type semiconductor layer 7 is in direct contact with the light-emitting layer 8 in the preceding embodiment. The n-type semiconductor layer 7 and the light-emitting layer 8 are both semiconductors. Unlike typical light-emitting elements built around inorganic semiconductors, no layered structure is formed through epitaxial growth in the light-emitting element 2 in accordance with the present embodiment. It is therefore difficult in the present embodiment to prevent an energy level from developing at the surface and interface of each layer in the light-emitting element 2. An interfacial energy level hence develops at the interface between the n-type semiconductor layer 7 and the shell 20.

Figure 5:
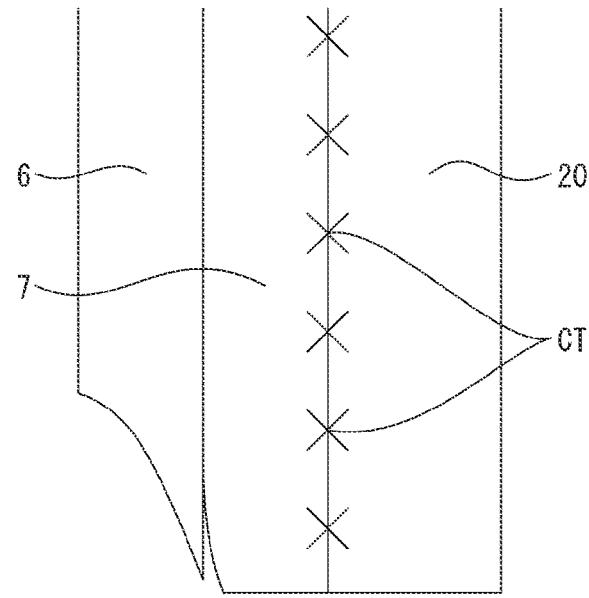
FIG. 5 is a set of enlarged energy band diagrams for layers in a light-emitting element in accordance with Embodiment 2 of the present disclosure and layers in a light-emitting element in accordance with a comparative example, depicting the effects of the light-emitting element in accordance with Embodiment 2 of the present disclosure.
Figure 5:
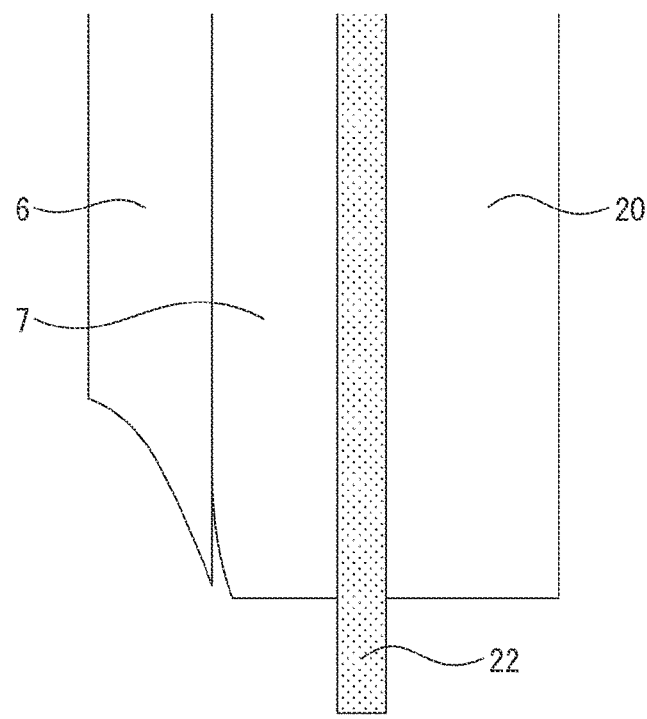

Carrier traps CT are thus formed along the interface between the n-type semiconductor layer 7 and the shell 20 as shown in (a) of FIG. 5. When the carrier traps CT trap the holes transported from the anode 4, the concentration of the holes transported to the light-emitting layer 8 may fall, possibly degrading charge carrier balance in the light-emitting layer 8.

In contrast, in the embodiment, the non-conducting layer 22 is provided between the n-type semiconductor layer 7 and the light-emitting layer 8 as shown in (b) of FIG. 5. Both the contact between the n-type semiconductor layer 7 and the non-conducting layer 22 and the contact between the non-conducting layer 22 and the light-emitting layer 8 are made by a semiconductor and a non-conductor.

This structure of the present embodiment inactivates the interfacial energy level at the interface between the n-type semiconductor layer 7 and the non-conducting layer 22 and at the interface between the non-conducting layer 22 and the light-emitting layer 8, thereby restraining formation of the carrier traps CT. The holes transported from the anode 4 are therefore less frequently trapped by the carrier traps CT, which further improves charge carrier balance in the light-emitting layer 8.

The non-conducting layer 22 preferably has a thickness of greater than or equal to 1 nm in the present embodiment from the point of view of more reliably forming the non-conducting layer 22 and reducing the carrier traps with the non-conducting layer 22. The non-conducting layer 22 preferably has a thickness of less than or equal to 5 nm to achieve a sufficient hole tunneling effect with the non-conducting layer 22 in the present embodiment.

Embodiment 3

Figure 6:
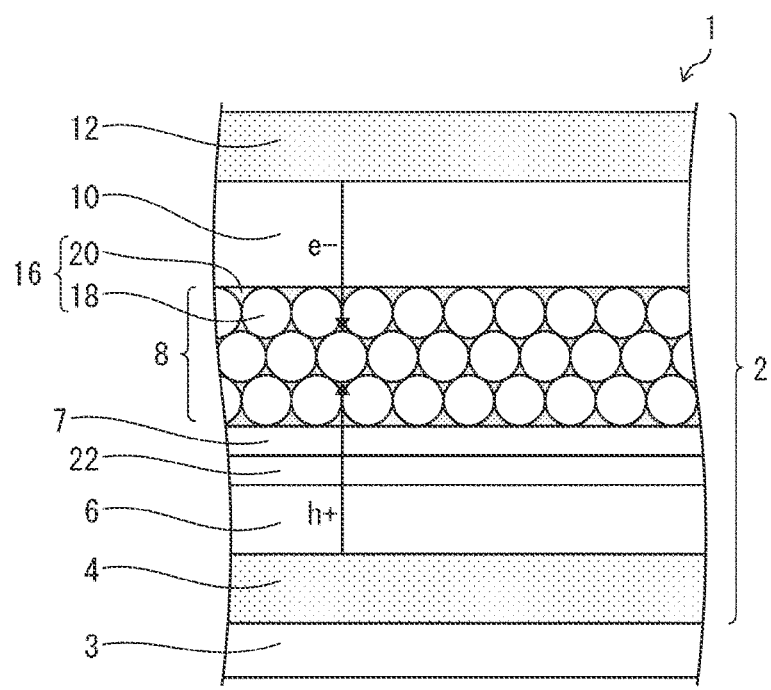
FIG. 6 is a schematic cross-sectional view of a light-emitting device in accordance with Embodiment 3 of the present disclosure.

FIG. 6 is a schematic cross-sectional view of a light-emitting device 1 in accordance with the present embodiment. The light-emitting device 1 in accordance with the present embodiment has the same structure as the light-emitting device 1 in accordance with any of the preceding embodiments, except that the former includes a non-conducting layer 22 between the hole transport layer 6 and the n-type semiconductor layer 7. The non-conducting layer 22 may have the same structure as the non-conducting layer 22 in the light-emitting device 1 in accordance with the preceding embodiment.

The light-emitting element 2 in accordance with the present embodiment operates by the same mechanism as the light-emitting element 2 in accordance with any of the preceding embodiments, transporting holes and electrons so as to generate excitons in the light-emitting layer 8. A notable difference lies in that in the former, holes are injected from the hole transport layer 6 to the n-type semiconductor layer 7 by tunneling through the non-conducting layer 22 by virtue of the tunneling effect of the non-conducting layer 22.

The effects of the light-emitting element 2 in accordance with the present embodiment will be described next by comparing an energy band diagram for the light-emitting element 2 in accordance with the present embodiment with an energy band diagram for the light-emitting element 2 in accordance with Embodiment 1, both diagrams being shown in FIG. 7. Portions (a) and (b) of FIG. 7 are enlarged energy band diagrams for the light-emitting element 2 in accordance with Embodiment 1 and the light-emitting element 2 in accordance with the present embodiment respectively, selectively showing only the vicinity of the ionization potential from the hole transport layer 6 to the n-type semiconductor layer 7.

The p-n junction formed by the hole transport layer 6 and the n-type semiconductor layer 7 changes the ionization potential not only in the hole transport layer 6 but also in the n-type semiconductor layer 7 in the light-emitting element 2 in accordance with Embodiment 1. Because the n-type semiconductor layer 7 has a higher carrier density than the hole transport layer 6, the changes in the ionization potential in the n-type semiconductor layer 7 are small and only occur in close proximity to the contact interface with the hole transport layer 6.

Figure 7:
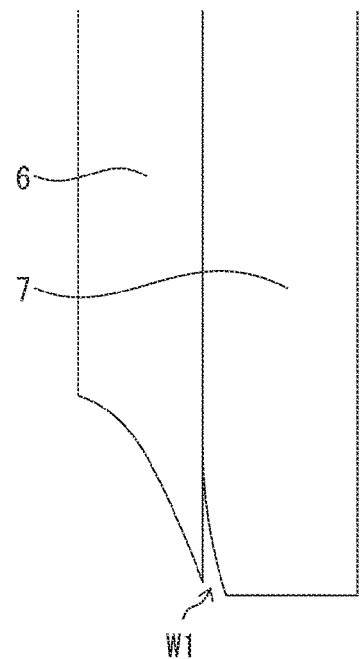
FIG. 7 is a set of enlarged energy band diagrams for layers in a light-emitting element in accordance with Embodiment 3 of the present disclosure and layers in a light-emitting element in accordance with a comparative example, depicting the effects of the light-emitting element in accordance with Embodiment 3 of the present disclosure.
Figure 7:
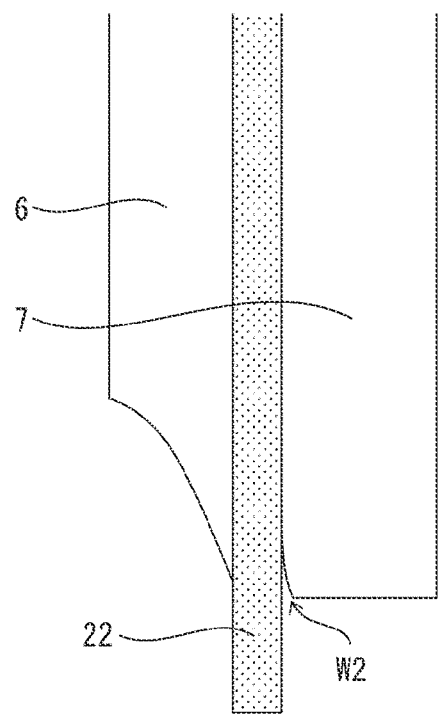

A potential well W1 in which the ionization potential is lower than in the surroundings is thus formed on the n-type semiconductor layer 7 side of the interface between the hole transport layer 6 and the n-type semiconductor layer 7 as shown in (a) of FIG. 7. The potential well W1 may trap the holes transported from the anode 4. Therefore, in the light-emitting element 2 in accordance with Embodiment 1, the concentration of the holes transported to the light-emitting layer 8 may fall, possibly degrading charge carrier balance in the light-emitting layer 8.

In contrast, in the light-emitting element 2 in accordance with the present embodiment, the non-conducting layer 22 is provided between the hole transport layer 6 and the n-type semiconductor layer 7. This structure does not allow direct contact between the hole transport layer 6 and the n-type semiconductor layer 7, thereby causing carriers to move from the n-type semiconductor layer 7 to the hole transport layer 6 via the non-conducting layer 22.

Therefore, compared with the structure in which the hole transport layer 6 and the n-type semiconductor layer 7 form a direct p-n junction, the changes in the ionization potential in the n-type semiconductor layer 7 are smaller due to the p-n junction. Specifically, the changes in the ionization potential in the n-type semiconductor layer 7 are smaller and only occur in closer proximity to the contact interface with the hole transport layer 6 than those changes in the n-type semiconductor layer 7 in the light-emitting element 2 in accordance with Embodiment 1.

A potential well W2 is hence formed at the interface between the hole transport layer 6 and the n-type semiconductor layer 7 as shown in (b) of FIG. 7. The potential well W2 is smaller in area and shallower than the potential well W1 for the reasons described above. The present embodiment can therefore reduce the possibility of the holes transported from the anode 4 being trapped by the potential well W2 over Embodiment 1, which further improves charge carrier balance in the light-emitting layer 8.

Similarly to the light-emitting element 2 in accordance with any of the preceding embodiments, the light-emitting element 2 in accordance with the present embodiment may include the additional non-conducting layer 22 between the n-type semiconductor layer 7 and the light-emitting layer 8. This structure can reduce hole traps between the n-type semiconductor layer 7 and the light-emitting layer 8, which further improves charge carrier balance in the light-emitting layer 8.

The present disclosure is not limited to the description of the embodiments above and may be altered within the scope of the claims. Embodiments based on a proper combination of technical means disclosed in different embodiments are encompassed in the technical scope of the present disclosure. Furthermore, new technological features can be created by combining different technical means disclosed in the embodiments.

The invention claimed is:

1. A light-emitting element comprising:
an anode;
a hole transport layer of a p-type semiconductor;
an n-type semiconductor layer;
a light-emitting layer containing quantum dots; and
a cathode, arranged in this order,
wherein the hole transport layer and the n-type semiconductor layer form a p-n junction, and
the n-type semiconductor layer contains a first semiconductor material that comprises a Group II-VI semiconductor material.

2. The light-emitting element according to claim 1, wherein
the quantum dots have a core/shell structure, and
shells of the quantum dots contain a second semiconductor material that is a Group II-VI semiconductor material.

3. The light-emitting element according to claim 2, wherein the first semiconductor material is either the same as the second semiconductor material or a Group II-VI semiconductor material containing a Group II element that, in a periodic table, is placed in a period below the Group II element contained in the second semiconductor material.

4. The light-emitting element according to claim 1, wherein the first semiconductor material comprises at least one Group XIII element selected from B, Al, Ga, and In.

5. The light-emitting element according to claim 1, wherein the first semiconductor material comprises a Group XIII element in a concentration from $10^{16}$ cm$^{-3}$ to $10^{22}$ cm$^{-3}$.

6. The light-emitting element according to claim 1, wherein the n-type semiconductor layer has a thickness from 1 nm to 5 nm.

7. A light-emitting element comprising:
an anode; a hole transport layer of a p-type semiconductor; an n-type semiconductor layer;
a light-emitting layer containing quantum dots; and a cathode, arranged in this order; and
a non-conducting layer of a non-conductor between the n-type semiconductor layer and the light-emitting layer,
wherein the hole transport layer and the n-type semiconductor layer form a p-n junction.

8. The light-emitting element according to claim 7, wherein the non-conducting layer has a thickness from 1 nm to 5 nm.

9. The light-emitting element according to claim 7, wherein the non-conductor contains at least one species selected from the group consisting of $Al_2O_3$, SiN, $SiO_2$, SiON, and $Cr_2O_3$.

10. The light-emitting element according to claim 1, wherein the hole transport layer contains any of an oxide of a Group IIA element, an oxide of a Group VIB element, and an oxide of a Group VIIIB element.

11. The light-emitting element according to claim 1, wherein the hole transport layer contains at least any of MgO, $Cr_2O_3$, and NiO.

12. The light-emitting element according to claim 1, wherein the hole transport layer has a carrier concentration from $10^{16}$ cm$^{-3}$ to $10^{22}$ cm$^{-3}$.

13. A light-emitting element comprising:
an anode;
a hole transport layer of a p-type semiconductor;
an n-type semiconductor layer;
a light-emitting layer containing quantum dots; and
a cathode, arranged in this order,
wherein the hole transport layer and the n-type semiconductor layer form a p-n junction, and
the n-type semiconductor layer contains a Group XIII element.

14. The light-emitting element according to claim 13, wherein the n-type semiconductor layer further contains a first semiconductor material that is a Group II-VI semiconductor material.

15. The light-emitting element according to claim 13, wherein the Group XIII element is selected from B, Al, Ga, and In.

16. The light-emitting element according to claim 1, wherein the anode and the hole transport layer are in direct contact.

17. The light-emitting element according to claim 13, wherein the hole transport layer and the n-type semiconductor layer are in direct contact.

18. The light-emitting element according to claim 13, further comprising a non-conducting layer of a non-conductor between the n-type semiconductor layer and the hole transport layer.

19. The light-emitting element according to claim 13, wherein the anode and the hole transport layer are in direct contact.

20. The light-emitting element according to claim 13, further comprising an electron transport layer.

* * * * *